(12) United States Patent
Yang

(10) Patent No.: US 7,018,905 B1
(45) Date of Patent: Mar. 28, 2006

(54) METHOD OF FORMING ISOLATION FILM IN SEMICONDUCTOR DEVICE

(75) Inventor: Young Ho Yang, Chungcheongbuk-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 21 days.

(21) Appl. No.: 11/150,033

(22) Filed: Jun. 10, 2005

(30) Foreign Application Priority Data

Dec. 28, 2004 (KR) ...................... 10-2004-0114180

(51) Int. Cl.
*H01L 21/762* (2006.01)

(52) U.S. Cl. ...................... 438/424; 438/692
(58) Field of Classification Search ................ 438/424, 438/692, FOR 227
See application file for complete search history.

(56) References Cited

U.S. PATENT DOCUMENTS

| | | | |
|---|---|---|---|
| 5,994,202 A * | 11/1999 | Gambino et al. | 438/433 |
| 6,090,683 A * | 7/2000 | Torek | 438/424 |
| 6,180,492 B1 * | 1/2001 | Shih et al. | 438/435 |
| 6,475,875 B1 * | 11/2002 | Hau et al. | 438/424 |
| 6,500,712 B1 * | 12/2002 | Wu | 438/257 |
| 6,596,607 B1 * | 7/2003 | Ahn | 438/424 |
| 6,798,038 B1 * | 9/2004 | Sato et al. | 257/510 |
| 2002/0090830 A1 * | 7/2002 | Inumiya et al. | 438/766 |
| 2002/0123206 A1 * | 9/2002 | Hong et al. | 438/424 |
| 2002/0197823 A1 * | 12/2002 | Yoo et al. | 438/424 |
| 2003/0027404 A1 * | 2/2003 | Lai et al. | 438/424 |
| 2003/0100167 A1 * | 5/2003 | Shimizu | 438/424 |

* cited by examiner

*Primary Examiner*—George Fourson
(74) *Attorney, Agent, or Firm*—Marshall, Gerstein & Borun LLP

(57) ABSTRACT

The present invention relates to a method of forming an isolation film of a semiconductor device. According to the present invention, the method includes the steps of forming a pad film on a semiconductor substrate, and patterning the pad film of a predetermined region and a predetermined depth of the semiconductor substrate to form trenches, forming sidewall oxide films on sidewalls of the trenches thereby defining a non-active region and an active region, forming a first oxide film for trench burial on the entire surface including the sidewall oxide films, and then performing a polishing process until the pad film is exposed, thus forming a first isolation film, removing the pad film to expose the semiconductor substrate in the active region, forming a silicon layer, which has a height higher than that of the first isolation film, on the exposed semiconductor substrate in the active region, and forming a second oxide film for trench burial on the entire surface, and then performing a polishing process until the silicon layer is exposed, thus forming a second isolation film, whereby an isolation film in which the first isolation film and the second isolation film are stacked is formed.

8 Claims, 2 Drawing Sheets

METHOD OF FORMING ISOLATION FILM IN SEMICONDUCTOR DEVICE

BACKGROUND

1. Field of the Invention

The present invention relates to a method of manufacturing semiconductor devices, and more specifically, to a method of forming isolation films of semiconductor devices.

2. Discussion of Related Art

In a method of manufacturing semiconductor devices, an isolation film for separately defining an active region and a non-active region is formed. Recently, as semiconductor device becomes higher integrated and dense, a STI (Shallow Trench Isolation) process has been employed.

As the depth of the isolation film increases due to reduction of a pattern space even through the STI process, however, void, etc. is generated in insulation films buried in trenches.

Further, when the isolation film is formed by means of the STI process, the semiconductor substrate is etched to form the trench. As plasma is used upon etching, there is a problem in that plasma damages are generated in the semiconductor substrate that will be defined as the active region.

Furthermore, as plasma is used in a deposition process of the insulation film, there is also a problem in that plasma damages are generated.

Moreover, in the formation process of the isolation film, sidewall oxide films are formed on trenches sidewalls. In this case, there is a problem in that moat fail is generated in top corners of the isolation film due to the sidewall oxide films.

SUMMARY OF THE INVENTION

Accordingly, the present invention has been made in view of the above problems, and it is an object of the present invention to provide a method of forming isolation films of semiconductor devices, wherein plasma damages generated in a process of forming the isolation film can be prevented.

Another object of the present invention is to provide a method of forming isolation films of semiconductor devices, wherein moat fail generated in the isolation films can be prevented.

To achieve the above objects, according to the present invention, there is provided a method of forming an isolation film of a semiconductor device, including the steps of forming a pad film on a semiconductor substrate, and patterning the pad film of a predetermined region and a predetermined depth of the semiconductor substrate to form trenches, forming sidewall oxide films on sidewalls of the trenches thereby defining a non-active region and an active region, forming a first oxide film for trench burial on the entire surface including the sidewall oxide films, and then performing a polishing process until the pad film is exposed, thus forming a first isolation film, removing the pad film to expose the semiconductor substrate in the active region, forming a silicon layer, which has a height higher than that of the first isolation film, on the exposed semiconductor substrate in the active region, and forming a second oxide film for trench burial on the entire surface, and then performing a polishing process until the silicon layer is exposed, thus forming a second isolation film, whereby an isolation film in which the first isolation film and the second isolation film are stacked is formed.

Preferably, the sidewall oxide film is performed by an oxidization process in which a silicon film of the semiconductor substrate of a silicon material and oxygen are combined together, or a process of depositing an oxide film.

The first oxide film for trench burial or the second oxide film for trench burial is preferably formed by one of LPCVD method, PECVD method and HDP CVD method, or an annealing process after spin coating using SOG (Spin On Glass) process.

The silicon layer is preferably formed by means of a selective epitaxial process using a Si-based source such as $SiH_2Cl_2$, $SiHCl_3$ or $SiCl_4$.

The predetermined depth of the patterned semiconductor substrate can be a depth that causes the first insulating film for trench burial to be easily buried in the trenches.

The predetermined depth of the patterned semiconductor substrate, which causes the first insulating film for trench burial to be easily buried in the trenches, is preferably about 500 to 1000 Å from a surface of the semiconductor substrate.

The method can further include the step of performing a hydrogen plasma cleaning process or an argon plasma cleaning process in the same chamber as a chamber in which the silicon formation process is performed before the formation process of the silicon layer.

The sidewall oxide film is preferably formed only between the first isolation film and the active region of the semiconductor substrate.

DETAILED DESCRIPTION OF PREFERRED EMBODIMENTS

Figure 1:
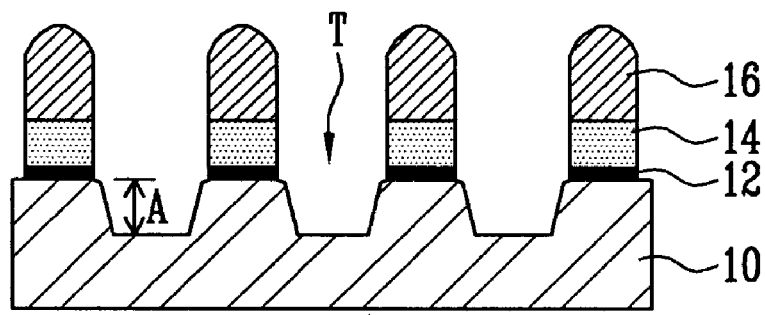
FIGS. 1 to 5 are cross-sectional views for explaining a method of forming an isolation film of a semiconductor device according to the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

FIGS. 1 to 5 are cross-sectional views for explaining a method of forming an isolation film of a semiconductor device according to the present invention.

Referring to FIG. 1, a pad oxide film and a pad nitride film are sequentially formed on the entire surface of a semiconductor substrate 10 made of a silicon material. Photoresist patterns 16 for forming isolation films are formed on the predetermined regions of the pad nitride film.

The pad nitride film, the pad oxide films and a predetermined depth of the semiconductor substrate are plasma-etched using the photoresist patterns 16 as an etch mask to form patterned pad nitride films 14, patterned pad oxide films 12 and the semiconductor substrate 10 that is patterned at a predetermined depth, thus forming trenches T to define a non-active region and an active region.

In this case, the predetermined depth A of the patterned semiconductor substrate is about 500 to 1000 Å from a surface of the semiconductor substrate. The depth is a depth that causes insulating films for trench burial to be easily buried in the trenches. It is therefore possible to prevent generation of fail in the trench burial process.

Furthermore, if the semiconductor substrate is etched by the depth, plasma damages caused in the semiconductor substrate that will be defined as an active region can be prevented.

Figure 2:
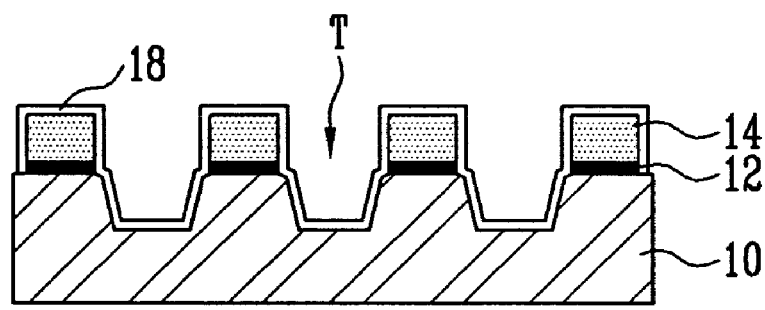

Referring to FIG. 2, an ashing process is performed on the entire surface including the trenches T to remove the photoresist patterns 16. A process of forming a sidewall oxide film 18 is then formed on the entire surface.

The process of forming the sidewall oxide film 18 can be performed by an oxidization process or a process of depositing an oxide film.

The sidewall oxide film 18 is formed so as to remove damages accompanied by the etch process, which is performed to define the trenches T.

Figure 3:
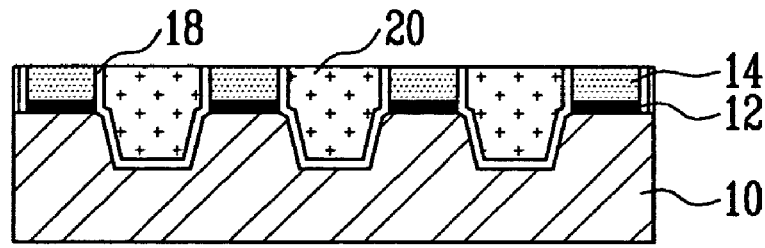

Referring to FIG. 3, a first oxide films for trench burial are formed on the entire surface including the sidewall oxide film 18. The first oxide film can be formed by means of one of LPCVD method, PECVD method and HDP CVD method, or an annealing process after spin coating using SOG (Spin On Glass) process.

A polishing process, such as CMP process or etch-back process, is performed on the entire surface including the oxide films for trench burial until the pad nitride films 14 are exposed, thereby completing formation of first isolation films 20.

Figure 4:
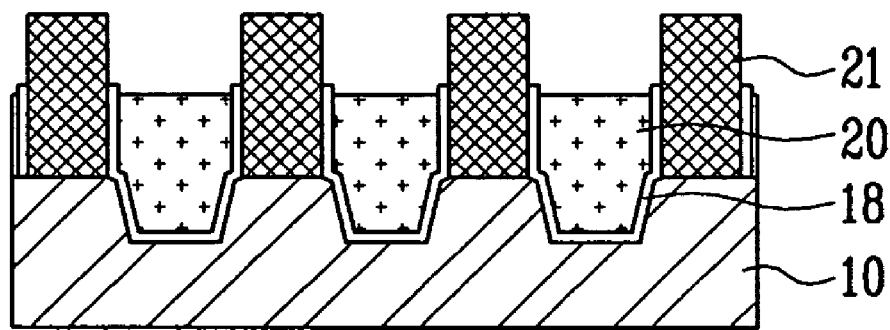

Referring to FIG. 4, the exposed pad nitride films 14 and the underlying pad oxide films 12 are removed by means of a wet process, and the semiconductor substrate on the active region corresponding to the region in which the isolation films 20 are formed is exposed. In the wet process for removing the pad nitride films 14, phosphoric acid ($H_3PO_4$) is used. In the wet process for removing the pad oxide films 12, high temperature treatment using HF is performed.

Silicon layers 21 are formed on the exposed semiconductor substrate on the active region corresponding to the region where the isolation films 20 are formed.

In the formation process of the silicon layers 21, the height of the silicon layers 21 is set to be higher than that of the first isolation films 20. In this case, the same oxide film as the first oxide film for trench burial can be further deposited on the first isolation films 20 in a subsequent process, so that the isolation film required in the device can be formed.

In other words, a thickness of the first isolation film, which is formed as the first oxide film for trench burial is buried, is 500 to 1000 Å. The thickness is a thickness that allows the insulating film for trench burial to be easily buried in the trench. A thickness of the isolation film, which is required in a device, can be formed by deposition of the second oxide film for trench burial.

The silicon layers 21 are formed by means of a selective epitaxial process. The selective epitaxial process can be performed by using a Si-based source such as $SiH_2Cl_2$, $SiHCl_3$ or $SiCl_4$, or $HC_1$ and $Cl_2$ gas added to $SiH_4$ and $Si_2H_6$.

The silicon layers 21 can be formed to a thickness of about 2000 to 2500 Å.

Meanwhile, before the formation process of the silicon layer, a hydrogen plasma cleaning process or an argon plasma cleaning process can be further performed in the same chamber as a chamber in which the silicon formation process is performed.

Figure 5:
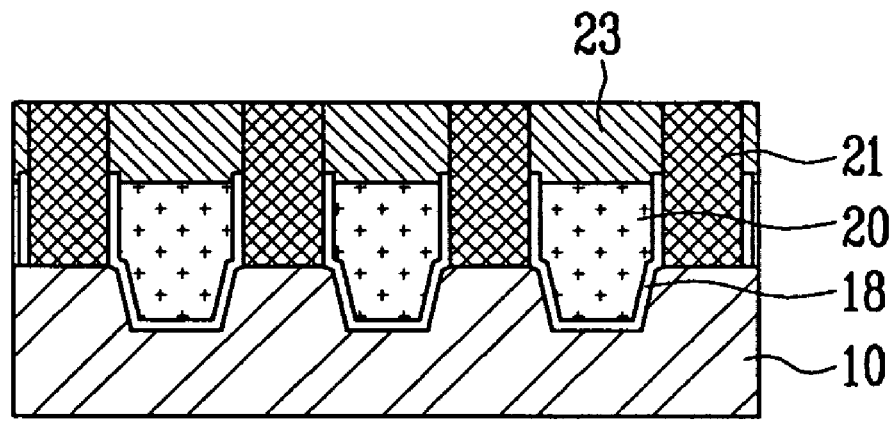

Referring to FIG. 5, a second oxide film for trench burial is formed on the entire surface. A polishing process such as CMP process or etch-back process is then performed until the silicon layers 21 are exposed. Thereby, the second oxide film for trench burial is deposited on the first isolation films 20, thus forming a second isolation film 23. A thickness of the isolation films 20 and 23 required in a device is thus formed.

Though not shown in the drawings, a gate oxide film is formed only on the silicon layer, and a process of forming a conductive film for gate electrode is then formed on the entire surface including the gate oxide film. Thereby, the present process is completed.

As described above, according to the present invention, if the semiconductor substrate is etched by the depth, plasma damages caused in the semiconductor substrate that will be defined as the active region can be prevented.

Furthermore, according to the present invention, in an etch process for forming trenches, the semiconductor substrate is patterned by a depth that can allow a subsequent insulating film for trench burial to be easily buried in the trench. It is thus possible to prevent generation of fail, which occurs in the trench burial process.

Moreover, according to the present invention, an oxide film is not formed on sidewalls of trenches in which a second isolation film is formed. It is thus possible to prevent generation of moat, which is caused by etched trench sidewall oxide films, which is generated due to etching of sidewall oxide films by chemical pre-treatment for forming a gate oxide film.

Furthermore, according to the present invention, a difference in a dopant concentration between a semiconductor substrate of a silicon material and a silicon layer formed by means of a selective epitaxial process is significant. It is thus possible to minimize irregular diffusion of the dopant and thus to exactly manage the energy band gap.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming an isolation film of a semiconductor device, comprising the steps of:

forming a pad film on a semiconductor substrate, and patterning the pad film of a predetermined region and a predetermined depth of the semiconductor substrate to form trenches thereby defining a non-active region and an active region;

forming sidewall oxide films on sidewalls of the trenches;

forming a first oxide film for trench burial on the entire surface including the sidewall oxide films, and then performing a polishing process until the pad film is exposed, thus forming a first isolation film;

removing the pad film to expose the semiconductor substrate in the active region;

forming a silicon layer, which has a height higher than that of the first isolation film, on the exposed semiconductor substrate in the active region; and forming a second oxide film for trench burial on the entire surface, and then performing a polishing process until the silicon layer is exposed, thus forming a second isolation film, whereby an isolation film in which the first isolation film and the second isolation film are stacked is formed.

2. The method as claimed in claim 1, wherein the sidewall oxide film is performed by an oxidization process in which a silicon film of the semiconductor substrate of a silicon material and oxygen are combined together, or a process of depositing an oxide film.

3. The method as claimed in claim 1, wherein the first oxide film for trench burial or the second oxide film for trench burial is formed by one of LPCVD method, PECVD method and HDP CVD method, or an annealing process after spin coating using SOG (Spin On Glass) process.

4. The method as claimed in claim 1, wherein the silicon layer is formed by means of a selective epitaxial process using a Si-based source such as $SiH_2Cl_2$, $SiHCl_3$ or $SiCl_4$.

5. The method as claimed in claim 1, wherein the predetermined depth of the patterned semiconductor substrate is a depth that causes the first insulating film for trench burial to be easily buried in the trenches.

6. The method as claimed in claim 5, wherein the predetermined depth of the patterned semiconductor substrate, which causes the first insulating film for trench burial to be easily buried in the trenches, is about 500 to 1000 Å from a surface of the semiconductor substrate.

7. The method as claimed in claim 1, further comprising the step of performing a hydrogen plasma cleaning process or an argon plasma cleaning process in the same chamber as a chamber in which the silicon formation process is performed before the formation process of the silicon layer.

8. The method as claimed in claim 1, wherein the sidewall oxide film is formed only between the first isolation film and the active region of the semiconductor substrate.

* * * * *